(12) United States Patent
Miller, Jr.

(10) Patent No.: US 6,281,726 B1
(45) Date of Patent: *Aug. 28, 2001

(54) DEVICE AND METHOD IN A DELAY LOCKED LOOP FOR GENERATING QUADRATURE AND OTHER OFF-PHASE CLOCKS WITH IMPROVED RESOLUTION

(75) Inventor: James E. Miller, Jr., Boise, ID (US)

(73) Assignee: Micron Technolgy, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/525,780

(22) Filed: Mar. 15, 2000

Related U.S. Application Data

(63) Continuation of application No. 09/102,989, filed on Jun. 22, 1998.

(51) Int. Cl.[7] ................................................ H03L 7/06
(52) U.S. Cl. ........................ 327/156; 327/160; 327/161
(58) Field of Search .................................... 327/158, 141, 327/146, 147, 149, 151, 152, 153, 154, 156, 160, 161, 163, 231, 238, 244, 245, 254, 255, 256, 257, 155

(56) References Cited

U.S. PATENT DOCUMENTS

| 5,173,617 | 12/1992 | Alsup et al. ........................ 327/158 |
| 5,537,069 | 7/1996 | Volk ..................................... 327/149 |
| 5,920,518 | 7/1999 | Harrison et al. ...................... 365/323 |
| 5,926,047 | 7/1999 | Harrison ............................... 327/159 |
| 5,945,862 | 8/1999 | Donnelly et al. ..................... 327/278 |
| 6,069,506 | * 5/2000 | Miller, Jr. et al. .................... 327/156 |
| 6,137,325 | * 10/2000 | Miller, Jr. ............................ 327/156 |

* cited by examiner

Primary Examiner—Timothy P. Callahan
Assistant Examiner—Hai L. Nguyen
(74) Attorney, Agent, or Firm—TraskBritt

(57) ABSTRACT

An inventive digital delay locked loop (DLL) for outputting at least first and second output clocks includes delay elements for receiving an input clock and outputting a first series of delayed clocks, each lagging the input clock more than its predecessor. A phase detector compares relative phases of the first output clock and the input clock and outputs count-up or count-down control signals in accordance therewith. First and second counters output respective first and second counts in response to the count-up or count-down control signals, and a first multiplexer selects and outputs the first output clock from among the first series of delayed clocks in accordance with the first count. Also, interpolation circuitry receives a portion of the first series of delayed clocks and outputs same, along with a plurality of interpolated clocks, in the form of a second series of delayed clocks, each lagging the input clock more than its predecessor. A second multiplexer then selects and outputs the second output clock from among the second series of delayed clocks in accordance with the second count. As a result, at least one of the clocks is generated with improved resolution over conventional DLLs.

19 Claims, 4 Drawing Sheets

US 6,281,726 B1

DEVICE AND METHOD IN A DELAY LOCKED LOOP FOR GENERATING QUADRATURE AND OTHER OFF-PHASE CLOCKS WITH IMPROVED RESOLUTION

CROSS REFERENCE TO RELATED APPLICATIONS

This application is a continuation of application Ser. No. 09/102,989, filed Jun. 22, 1998, pending. This application is related to a co-pending, commonly assigned application entitled "Method and Apparatus for Improving the Performance of Digital Delay Locked Loop Circuits," filed May 20, 1998, now U.S. Pat. No. 6,069,506.

BACKGROUND OF THE INVENTION

1. Field of the Invention

This invention relates in general to semiconductor-based electronics and, more specifically, to devices and methods in, for example, delay locked loops for generating quadrature and other off-phase clocks. Such devices and methods are particularly applicable to synchronous semiconductor devices, such as Synchronous Dynamic Random Access Memories (SDRAMS).

2. State of the Art

As shown in FIG. 1, a conventional Delay Locked Loop (DLL) 10 receives an input clock CLKIN at a 0° phase and generates an output clock CLKOUT that is 180° out of phase with the input clock CLKIN.

More specifically, n Delay Elements 12 of the DLL 10 receive the input clock CLKIN and output a series of increasingly delayed clocks $D^1, D^2, D^3, D^4, D^5, \ldots, D^n$. To illustrate this further, it may be the case, for example, that the delayed clocks $D^1, D^2, D^3, D^4, D^5$ are out of phase with the input clock CLKIN by 1°, 2°, 3°, 4°, and 5°, respectively.

In response to the count from a 1-to-n counter 14, an n-to-1 mux (i.e., multiplexer) 16 selects one of the delayed clocks $D^1, D^2, D^3, D^4, D^5, \ldots, D^n$ and outputs it as the output clock CLKOUT. The counter 14 is controlled by a phase detector 18 that compares the input clock CLKIN to the output clock CLKOUT. If the output clock CLKOUT lags the input clock CLKIN by less than 180°, the phase detector 18 directs the counter 14 to Count up until the output clock CLKOUT lags the input clock CLKIN by exactly 180°. Conversely, if the output clock CLKOUT lags the input clock CLKIN by more than 180°, the phase detector 18 directs the counter 14 to count down until the output clock CLKOUT lags the input clock CLKIN by exactly 180°. Of course, "exactly" is a relative term, since the fineness of control the phase detector 18 has over the output clock CLKOUT is limited by the selection of delayed clocks $D^1, D^2, D^3, D^4, D^5, \ldots D^n$ available from the n Delay Elements 12.

The DLL 10 described above generally works well for generating the 180° out of phase output clock CLKOUT. However, there is often a need to generate off-phase clocks at, for example, 90° and 270° at the same time a 180° clock is generated. Such off-phase clocks are generally referred to as "quadrature" clocks.

Accordingly, as shown in FIG. 2, another conventional DLL 20 is available for generating multiple clocks, including quadrature clocks. The DLL 20 receives an input clock CLKIN at a 0° phase and generates an output clock CLKOUT that is 180° out of phase and a quadrature clock CLKOUT that is 90° out of phase.

More specifically, x Delay Elements 22 of the DLL 20 receive the input clock CLKIN and output a series of increasingly delayed clocks $D^1, D^2, D^3, D^4, D^5, \ldots, D^x$. In response to the count from a 1-to-X counter 24, an x-to-1 mux 26 selects one of the delayed clocks $D^1, D^2, D^3, D^4, D^5, \ldots, D^x$ and outputs it as the quadrature clock CLKOUT at 90°. At the same time, x Delay Elements 28 receive the quadrature clock CLKOUT at 90° and output a series of increasingly delayed clocks $D^{x+1}, D^{x+2}, D^{x+3}, D^{x+4}, D^{+5}, \ldots, D^{2x}$. In response to the count from another 1-to-x counter 30, another x-to-1 mux 32 selects one of the delayed clocks $D^{x+1}, D^{x+2}, D^{x+3}, D^{x+4}, D^{x \times 5}, \ldots, D^{2x}$ and outputs it as the output clock CLKOUT at 180°.

The counters 24 and 30) are controlled by a phase detector 34 that compares the input clock CLKIN at 0° to the output clock CLKOUT at 180°. If the output clock CLKOUT lags the input clock CLKIN by less than 180°, the phase detector 34 directs the counters 24 and 30 to count up until the output clock CLKOUT lags the input clock CLKIN by exactly 180°. Conversely, if the output clock CLKOUT lags the input clock CLKIN by more than 180°, the phase detector 34 directs the counters 24 and 30 to count down until the output clock CLKOUT lags the input clock CLKIN by exactly 180°. As stated above, "exactly" is a relative term, since the fineness of control the phase detector 34 has over the output clock CLKOUT is limited by the selection of delayed clocks available from the n Delay Elements 22 and 28.

The DLL 20 described above thus provides multiple clocks, including quadrature clocks. However, the output clock CLKOUT generated by the DLL 20 has one-half the resolution of the output clock CLKOUT generated by the DLL 10 (FIG. 1). An example will illustrate this. Suppose that the change in phase between successive delayed clocks output by the Delay Elements 12 (FIG. 1), 22, and 28 is 1°. As a result, the output clock CLKOUT generated by the DLL 10 (FIG. 1) is accurate to within 1°, while the output clock CLKOUT generated by the DLL 20 is only accurate to within 2°. Such a reduction in resolution does not provide acceptable performance for today's high-speed electronics.

Therefore, there is a need in the art for devices and methods in, for example, delay locked loops for generating quadrature and other off-phase clocks with improved resolution.

SUMMARY OF THE INVENTION

A device for generating first and second output signals (e.g., output clocks), each of which lags an input signal (e.g., an input clock) by a controlled amount different than the other, includes circuitry (e.g., delay elements and interpolation circuitry) for receiving the input signal and outputting first and second series of delayed signals. "A controlled amount" of lag refers to, for example, an amount of time or a number of degrees or radians. Each delayed signal in each series lags the input signal more than its predecessor in its respective series, and the second series includes a portion of the first series and a plurality of signals interpolated therefrom. Circuitry (e.g., a phase detector) for comparing relative phases of at least one of the first and second output signals with the input signal outputs control signals (e.g., count-up and count-down control signals) in accordance with the comparison. Additional circuitry (e.g., counters and multiplexers) then responds to the control signals by selecting and outputting the first and second output signals from among the respective first and second series of delayed signals.

In other embodiments of this invention, the device described above is incorporated into a Synchronous Dynamic Random Access Memory (SDRAM) and an electronic system (e.g., a computer system), and is fabricated on the surface of a semiconductor substrate, such as a wafer.

In another embodiment of this invention, a delay locked loop (DLL) for outputting at least first and second output clocks includes a plurality of delay elements for receiving an input clock and outputting a first series of delayed clocks, each lagging the input clock more than its predecessor. A phase detector compares relative phases of the first output clock and the input clock and outputs control signals in accordance therewith. First and second counters output respective first and second counts in response to the control signals, and a first multiplexer selects and outputs the first output clock from among the first series of delayed clocks in accordance with the first count. Also, interpolation circuitry receives a portion of the first series of delayed clocks and outputs same, along with a plurality of interpolated clocks, in the form of a second series of delayed clocks, each lagging the input clock more than its predecessor. A second multiplexer then selects and outputs the second output clock from among the second series of delayed clocks in accordance with the second count.

In still another embodiment, first and second output signals are generated, each lagging an input signal by a controlled amount different than the other. Specifically, first and second series of delayed signals are generated, each lagging the input signal more than its predecessor, with the second series including a portion of the first series and a plurality of signals interpolated therefrom. Relative phases of at least one of the first and second output signals are compared with the input signal, and the first and second output signals arc selected and output from among the respective first and second series of delayed signals in accordance with the phase comparison.

DETAILED DESCRIPTION OF THE INVENTION

Figure 3:
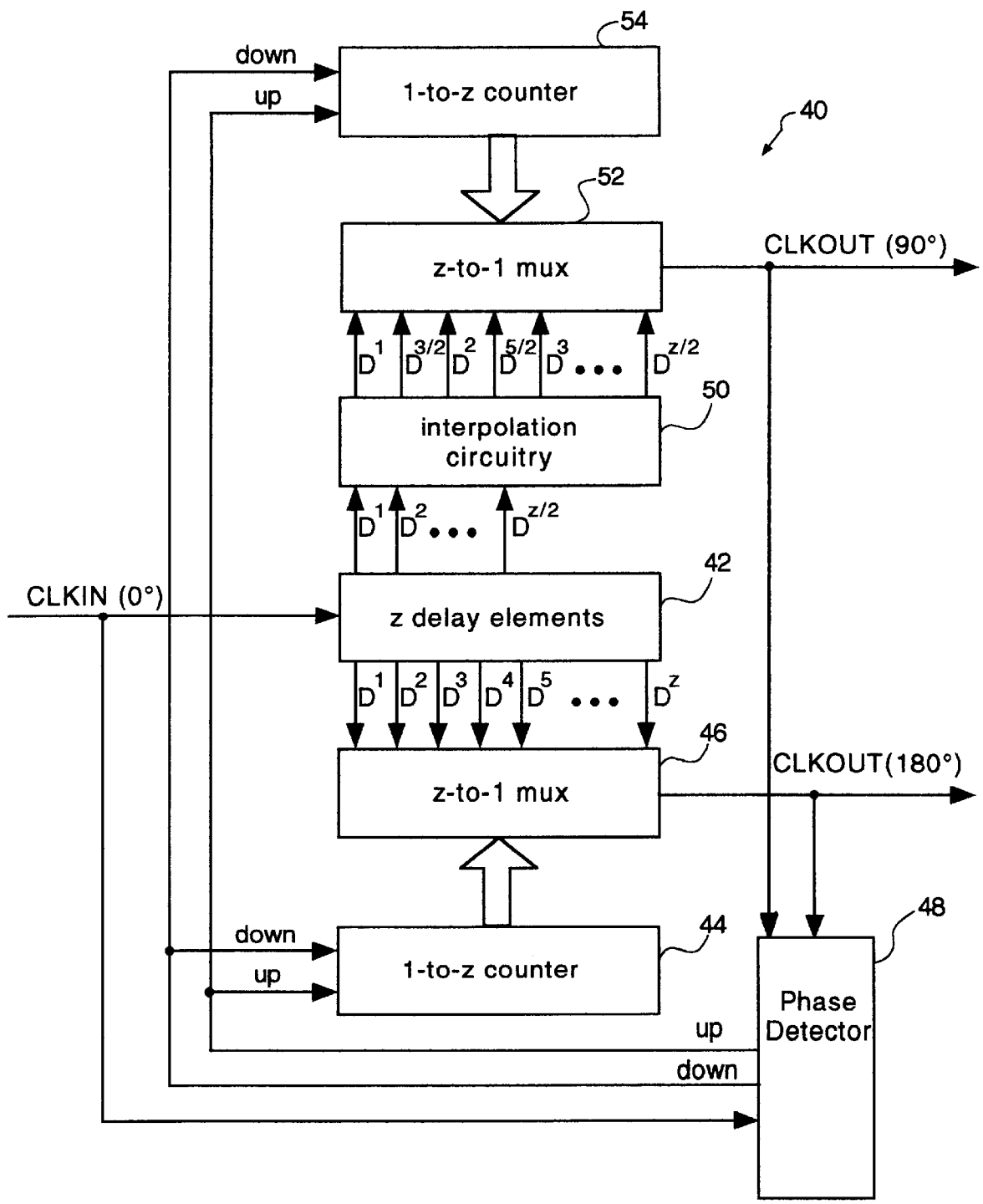
FIG. 3 is a block diagram illustrating a DLL, in accordance with this invention.

As shown in FIG. 3. a digital delay locked loop (DLL) 40 receives an input clock CLKIN at 0° and outputs an output clock CLKOUT at 180° and a quadrature clock CLKOUT at 90°. Although this invention will be described with respect to a DLL it will be understood by those having skill in the technical field of this invention that the invention is applicable to any circuitry for generating an output signal having a fixed phase relationship with an input signal. It will also be understood that this invention is not limited to use with just clock signals, nor is it limited to output signals having only a 90° or 180° phase relationship with an input signal.

More specifically, z Delay Elements 42 of the DLL 40 receive the input clock CLKIN and output a series of increasingly delayed clocks $D^1, D^2, D^3, D^4, D^5, \ldots, D^{z/2} \ldots, D^z$. In response to the count from a 1-to-z counter 44, a z-to-1 mux 46 selects one of the delayed clocks $D^1, D^2, D^3, D^4, D^5, \ldots, D^{z/2} \ldots, D^z$ and outputs it as the output clock CLKOUT at 180°.

The counter 44 is controlled by a phase detector 48 that compares the input clock CLKIN at 0° to the output clock CLKOUT at 180°. If the output clock CLKOUT lags the input clock CLKIN by less than 180°, the phase detector 48 directs the counter 44 to count up until the output clock CLKOUT lags the input clock CLKIN by exactly 180°. Conversely, if the output clock CLKOUT lags the input clock CLKIN by more than 180°, the phase detector 48 directs the counter 44 to count down until the output clock CLKOUT lags the input clock CLKIN by exactly 180°. Of course, "exactly" is a relative term, since the fineness of control the phase detector 48 has over the output clock CLKOUT is limited by the selection of delayed clocks available from the z Delay Elements 42.

Interpolation circuitry 50 receives one-half of the delayed clocks $D^1, D^2, D^3, D^4, D^5, \ldots, D^{z/2}$ and outputs these clocks $D^1, D^2, D^3, D^4, D^5, \ldots, D^{z/2}$, along with a series of interpolated clocks $D^{3/2}, D^{5/2}, D^{7/2}, D^{9/2}, D^{11/2}, \ldots$, to another z-to-1 mux 52. Another 1to-z counter 54 that is responsive to the phase detector 48 then causes the mux 52 to select the quadrature clock CLKOUT among the delayed clocks $D^1, D^2, D^3, D^4, D^5, \ldots, D^{z/2}$ and interpolated clocks $D^{3/2}, D^{5/2}, D^{7/2}, D^{9/2}, D^{11/2}, \ldots$. The interpolation circuitry 50 will be described in more detail below with respect to FIG. 4.

Figure 1:
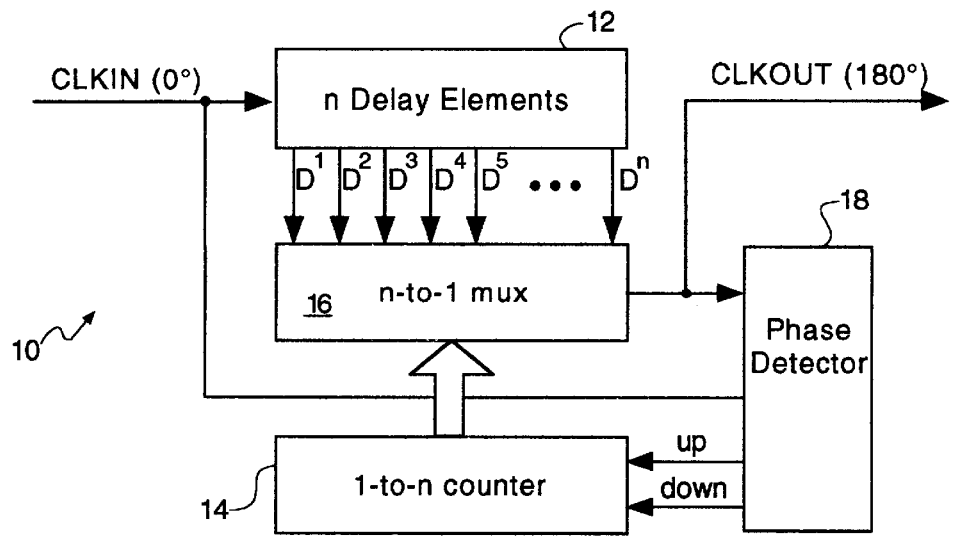
FIG. 1 is a block diagram illustrating a conventional delay locked loop (DLL)
Figure 2:
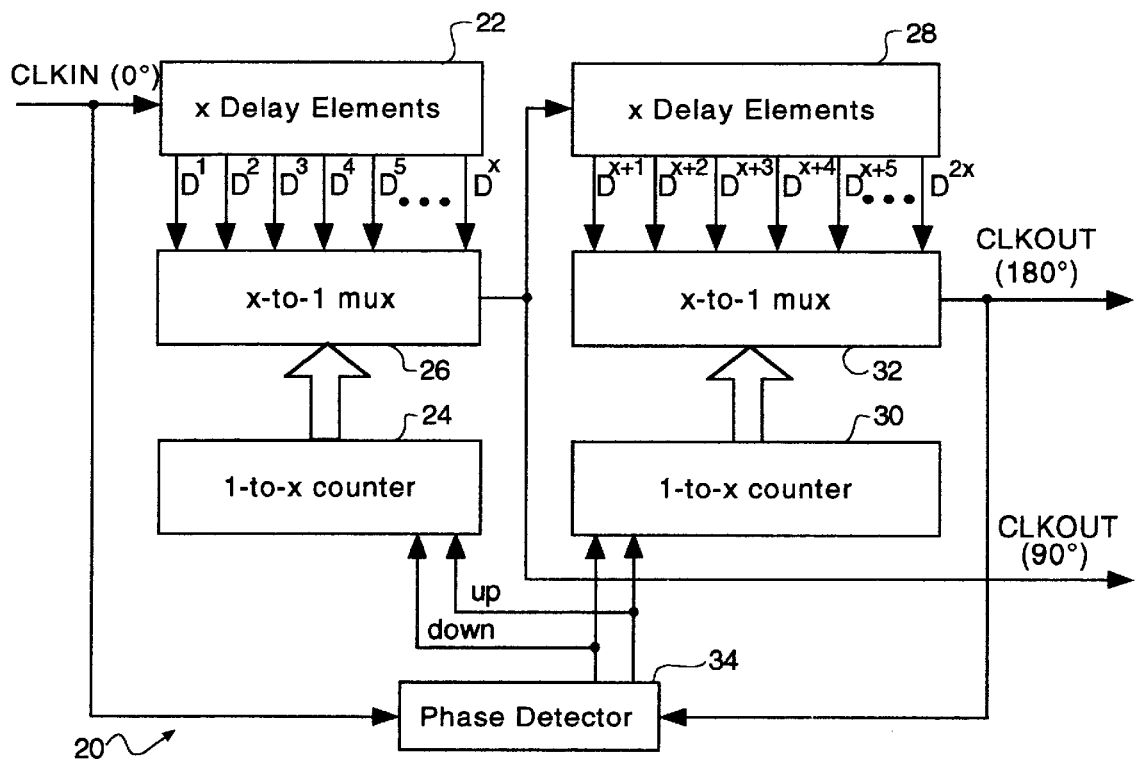
FIG. 2 is a block diagram illustrating another conventional DLL.

Since the delay between clocks selected by the z-to-1 mux 52 is one-half the delay between clocks selected by the z-to-1 mux 46, the quadrature clock CLKOUT at 90° has two times more resolution than the output clock CLKOUT at 180°. Thus, this invention provides a device for generating quadrature and other clocks with improved resolution over conventional circuitry, such as the DLL 20 described above with respect to FIG. 2.

It will be understood that circuitry other than muxes and counters for selecting among a group of delayed signals will also work for purposes of this invention. Also, it will be understood that a wide variety of delay elements may be used for purposes of this invention and, as such, fall within its scope.

Figure 4:
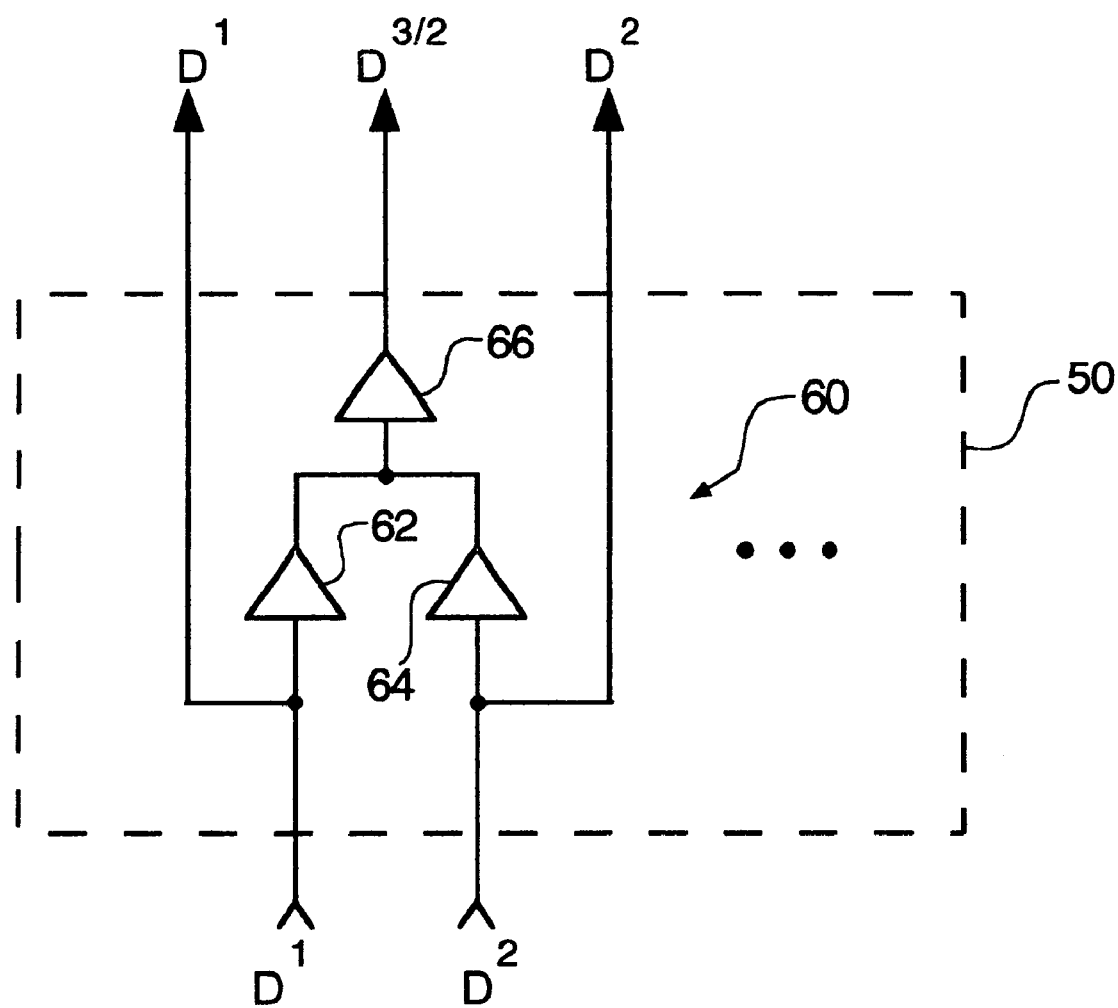
FIG. 4 is a circuit schematic illustrating interpolation circuitry of the DLL, of FIG. 3.

A portion 60 of the interpolation circuitry 50 of FIG. 3 is shown in more detail in FIG. 4. The portion 60 passes the delayed clocks $D^1$ and $D^2$ through. At the same time, a pair of buffers 62 and 64 receive the delayed clocks $D^1$ and $D^2$, respectively, and simultaneously drive the input to another buffer 66, which then outputs the interpolated clock $D^{3/2}$. An example will help illustrate this. If, for example, the delayed clocks $D^1$ and $D^2$ lag the input clock CLKIN (FIG. 3) by 1° and 2°, respectively, then the combined outputs of the buffers 62 and 64 will trip the buffer 66 such that the output of the buffer 66 lags the input clock CLKIN by about 1½°. Of course, it will be understood that a wide variety of interpolation circuits are applicable to this invention and, as such, fall within its scope.

Figure 5:
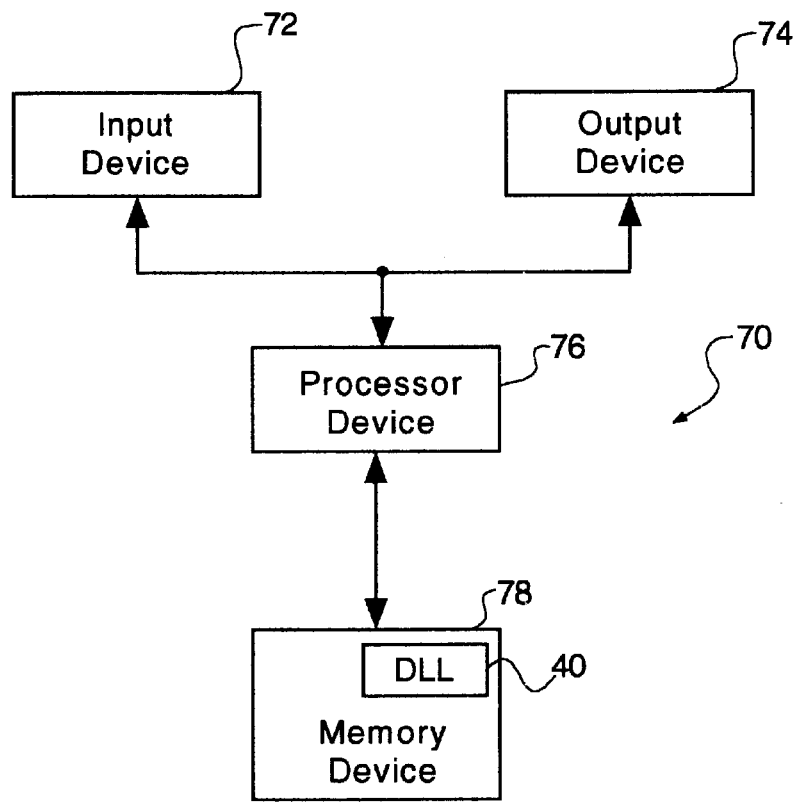
FIG. 5 is a block diagram illustrating an electronic system incorporating the DLL of FIG. 3.

As shown in FIG. 5, an electronic system 70, such as a computer system, includes an input device 72, an output device 74, a processor device 76, and a memory device 78, such as a Synchronous Dynamic Random Access Memory (SDRAM). The memory device 78 includes the DLL 40 of FIG. 3 It will be understood, though, that the DLL 40 may also be incorporated into any one of the input, output, and processor devices 72, 74, and 76.

Figure 6:
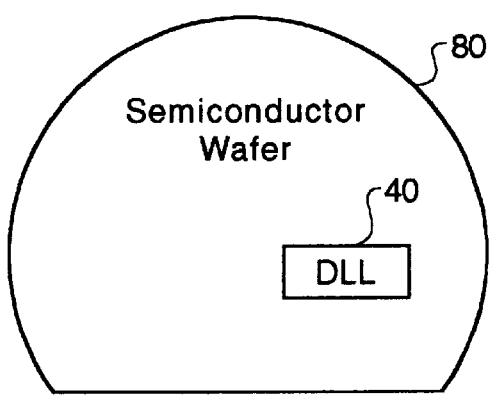
FIG. 6 is a diagram illustrating a semiconductor wafer on which the DLL of FIG. 3 is fabricated.

As shown in FIG. 6, the DLL 40 of FIG. 3 is fabricated on the surface of a semiconductor wafer 80 of silicon, gallium arsenide, or indium phosphide in accordance with this invention. Of course, it should be understood that the DLL 40 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although this invention has been described with reference to particular embodiments, the invention is not limited to these described embodiments. Rather, the invention is limited only by the appended claims, which include within their scope all equivalent devices and methods that operate according to the principles of the invention as described.

What is claimed is:

1. A device for outputting first and second output signals, the device comprising:
   circuitry configured to receive an input signal and output a first series of delayed signals, each delayed signal lagging the input signal more than its predecessor in the first series, the circuitry further configured to receive a second series of delayed signals including a portion of the first series and a plurality of signals interpolated therefrom;
   circuitry configured to compare relative phases of at least one of the first and second output signals and the input signal and outputting control signals in accordance therewith; and
   circuitry coupled to the receiving circuitry and the comparing circuitry for selecting and outputting the first and second output signals from among the respective first and second series of delayed signals in response to the control signals.

2. The device of claim 1, wherein the receiving circuitry comprises a plurality of delay elements and interpolation circuitry coupled thereto.

3. The device of claim 2, wherein the interpolation circuitry comprises a plurality of buffers, at least two of which have outputs coupled to an input of another of the plurality of buffers.

4. The device of claim 1, wherein the comparing circuitry comprises a phase detector for outputting count-up and count-down control signals.

5. The device of claim 1, wherein the device comprises a delay locked loop (DLL).

6. The device of claim 1, wherein at least one of the first and second output signals comprises a quadrature clock.

7. The device of claim 1, wherein the input signal comprises an input clock.

8. A delay locked loop configured to output at least a first and a second output clock signals, the delay locked loop comprising:
   a plurality of delay elements having at least one delay element configured to receive an input clock signal and in combination output a first series of delayed clock signals, each delayed clock signal lagging the input clock signal more than its predecessor in the first series;
   a phase detector configured to compare relative phases of the first output clock signal and the input clock signal and to output control signals in response to relative differences between the compared relative phases;
   first and second counters coupled to the phase detector and configured to output respective first and second count signals in response to the control signals;
   a first multiplexer coupled to each of the plurality of delay elements and the first counter, the first multiplexer configured to select and output the first output clock signal from among the first series of delayed clock signals in accordance with the first count signal;
   interpolation circuitry coupled to the plurality of delay elements and configured to produce a plurality of interpolated clock signals, the interpolation circuitry further configured to receive a portion of the first series of delayed clock signals and provide the plurality of interpolated clock signals and to output a second series of delayed clock signals, each delayed clock signal lagging the input clock signal more than its predecessor in the second series; and
   a second multiplexer coupled to the interpolation circuitry and to the second counter, the second multiplexer configured to select and output the second output clock signal from among the second series of delayed clock signals in accordance with the second count signal.

9. A Synchronous Dynamic Random Access Memory (SDRAM) including a delay locked loop (DLL) for outputting first and second output clock signals, each lagging an input clock signal by a controlled amount different than the other, the Dll comprising:
   circuitry configured to receive the input clock signal and output a first series of delayed clock signals, each delayed clock signal lagging the input clock signal more than its predecessor in the first series, the circuitry further configured to receive a second series of delayed clock signals including a portion of the first series and a plurality of clocks interpolated therefrom;
   circuitry configured to compare relative phases of at least one of the first and second output clock signal and the input clock signal and outputting control signals in accordance therewith; and
   circuitry coupled to the receiving circuitry and the comparing circuitry for selecting and outputting the first and second output clock signals from among the respective first and second series of delayed clock signals in response to the control signals.

10. An electronic system comprising an input device, an output device, a memory device, and a processor device coupled to the input, output, and memory devices, at least one of the input, output, processor, and memory devices including a device for outputting first and second output signals, the device comprising:
    circuitry configured to receive an input signal and output a first series of delayed signals, each delayed signal lagging the input signal more than its predecessor in the first series, the circuitry further configured to receive a second series of delayed signals including a portion of the first series and a plurality of signals interpolated therefrom;
    circuitry configured to compare relative phases of at least one of the first and second output signals and the input signal and outputting control signals in accordance therewith; and
    circuitry coupled to the receiving circuitry and the comparing circuitry for selecting and outputting the first and second output signals from among the respective first and second series of delayed signals in response to the control signals.

11. The electronic system of claim 10, wherein the electronic system comprises a computer system.

12. The electronic system of claim 10, wherein the memory device comprises a Synchronous Dynamic Random Access Memory (SDRAM).

13. A semiconductor substrate having a device fabricated on a surface thereof for outputting first and second output signals, each lagging an input signal by a controlled amount different than the other, the device comprising:

circuitry configured to receive an input signal and output a first series of delayed signals, each delayed signal lagging the input signal more than its predecessor in the first series, the circuitry further configured to receive a second series of delayed signals including a portion of the first series and a plurality of signals interpolated therefrom;

circuitry configured to compare relative phases of at least one of the first and second output signals and the input signal and outputting control signals in accordance therewith; and circuitry coupled to the receiving circuitry and the comparing circuitry for selecting and outputting the first and second output signals from among the respective first and second series of delayed signals in response to the control signals.

14. The semiconductor substrate of claim 13, wherein the semiconductor substrate comprises a semiconductor wafer.

15. A method of generating a first and a second output signal, the method comprising:

generating a first series of delayed signals, each delayed signal in the first series lagging the input signal more than its predecessor and having a phase relative to the input signal;

generating a second series of delayed signals, each delayed signal in the second series lagging the input signal more than its predecessor and having a phase relative to the input signal, the second series including a portion of the first series and a plurality of signals interpolated therefrom;

comparing the relative phases of at least one delayed signal of the first and second series of delayed signals and the input signal; and selecting and outputting the first and second output signals from among the respective first and second series of delayed signals in accordance with the phase comparison.

16. The method of claim 15, wherein the generating the first and second series of delayed signals comprise generating said series using a plurality of delay elements and interpolation circuitry.

17. A method of generating an off-phase clock signal, the method comprising:

generating a first series of delayed signals, each delayed signal in the first series lagging an input signal more than its predecessor and having a phase relative to the input signal;

generating a second series of delayed signals, each delayed signal in the second series lagging the input signal more than its predecessor and having a phase relative to the input signal, the second series including a portion of the first series and a plurality of signals interpolated therefrom;

comparing relative phases of at least one delayed signal of the first and second series of delayed signals and the input signal; and selecting and outputting first and second output signals from among the respective first and second series of delayed signals in accordance with the relative phase comparison.

18. The method of claim 17, wherein the off-phase clock signal is a quadrature clock signal.

19. The method of claim 17, wherein selecting and outputting the first and second output signals from among the respective first and second series of delayed signals comprises selecting a first signal from the first series of delayed signals which is 180° out of phase with the input signal and a second signal from the second series of delayed signals which is 90° out of phase with the input signal.

* * * * *

UNITED STATES PATENT AND TRADEMARK OFFICE
CERTIFICATE OF CORRECTION

PATENT NO. : 6,281,726 B1  
DATED : August 28, 2001  
INVENTOR(S) : James E. Miller, Jr.

It is certified that error appears in the above-identified patent and that said Letters Patent is hereby corrected as shown below:

Column 1,
Line 41, change "Count" to -- count --

Column 2,
Line 12, change "30)" to -- 30 --

Column 3,
Line 31, change "arc" to -- are --
Lines 42 and 45, delete the comma after "DLL"
Line 58, insert a comma after "DLL"

Column 4,
Line 24, change "1to-z" to -- 1-to-z --
Line 47, change "$D^2$through" to -- $D^2$ through --

Column 6,
Line 21, change "D11" to -- DLL --

Column 7,
Line 21, after "lagging" change "the" to -- an --
Line 30, before "relative" delete "the"
Line 35, after "the" and before "phase" insert -- relative --

Signed and Sealed this

Sixteenth Day of March, 2004

JON W. DUDAS  
*Acting Director of the United States Patent and Trademark Office*